(12) United States Patent
Wang (10) Patent No.: US 11,860,555 B2
(45) Date of Patent: Jan. 2, 2024

(54) ALIGNMENT MARK COUNT ACQUIRING METHOD AND DEVICE

(71) Applicant: CHANGXIN MEMORY TECHNOLOGIES, INC., Hefei (CN)

(72) Inventor: Heng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 8 days.

(21) Appl. No.: 17/648,670

(22) Filed: Jan. 22, 2022

(65) Prior Publication Data

US 2022/0317584 A1 Oct. 6, 2022

Related U.S. Application Data

(63) Continuation of application No. PCT/CN2021/108469, filed on Jul. 26, 2021.

(30) Foreign Application Priority Data

Mar. 30, 2021 (CN) .......................... 202110339784.0

(51) Int. Cl.
*G03F 9/00* (2006.01)
(52) U.S. Cl.
CPC .................... *G03F 9/7088* (2013.01)
(58) Field of Classification Search
CPC .... G03F 9/7088; G03F 9/7003; G03F 9/7073; G03F 9/7011
See application file for complete search history.

(56) References Cited

U.S. PATENT DOCUMENTS

| 7,190,455 B2 | 3/2007 | Matsumoto |
| 9,377,702 B2 | 6/2016 | Kawamura |
| 2004/0150824 A1 | 8/2004 | Matsumoto |

(Continued)

FOREIGN PATENT DOCUMENTS

| CN | 110361938 A | 10/2019 |
| JP | H0493013 A | 3/1992 |

(Continued)

OTHER PUBLICATIONS

Machine translation of the written opinion of PCT/CN2021/108469, dated Oct. 2022.*
Machine translation of JP 2006-013090, Jan. 2006.*

*Primary Examiner* — Peter B Kim
(74) *Attorney, Agent, or Firm* — Syncoda LLC; Feng Ma (57) ABSTRACT

An alignment mark count acquiring method includes: acquiring a first time at which an exposure machine performs exposure of a first wafer, and acquiring a second time at which the exposure machine performs alignment of a second wafer; acquiring a first buffer time between the second time and the first time when the first time is less than the second time; determining a target alignment mark count of the second wafer according to the exposure parameters of the first wafer and the corresponding relationship when the first buffer time is greater than a preset value, wherein the corresponding relationship is the relationship between the exposure parameters and the alignment mark counts, and the corresponding relationship is used to make the first buffer time to be less than or equal to the preset value; and outputting the target alignment mark count.

15 Claims, 7 Drawing Sheets

(56) References Cited

U.S. PATENT DOCUMENTS

| | | |
|---|---|---|
| 2007/0081161 A1 | 4/2007 | Matsumoto |
| 2011/0216293 A1* | 9/2011 | Padiy .................... G03F 9/7019 355/52 |
| 2014/0186755 A1* | 7/2014 | Sasaki ....................... G03F 7/20 430/30 |
| 2015/0205211 A1 | 7/2015 | Kawamura |

FOREIGN PATENT DOCUMENTS

| | | |
|---|---|---|
| JP | H09148236 A | 6/1997 |
| JP | 2006013090 A | 1/2006 |

* cited by examiner

ALIGNMENT MARK COUNT ACQUIRING METHOD AND DEVICE

CROSS-REFERENCE TO RELATED APPLICATIONS

This is a continuation of International Patent Application No. PCT/CN2021/108469 filed on Jul. 26, 2021, which claims priority to Chinese Patent Application No. 202110339784.0 filed on Mar. 30, 2021. The disclosures of the above-referenced applications are hereby incorporated by reference in their entirety.

BACKGROUND

An exposure machine refers to a device that transfers image information on a film and other transparent bodies to a surface coated with a photosensitive substance by turning on light to emit ultraviolet rays. When a product is made by photolithography exposure of a semiconductor, a layer of photosensitive material (such as a liquid photosensitive adhesive, a photosensitive anti-corrosion dry film, etc.) is coated on a substrate at first, and then the photosensitive material coated on the substrate is subjected to optical radiation to change the solubility of the photosensitive material. Under the action of a developing solution, the photosensitive material with a non-photosensitive part is dissolved, and the photosensitive material with a photosensitive part is retained on the substrate to form an image.

SUMMARY

The present disclosure relates, but not limited, to an alignment mark count acquiring method and device.

The embodiment of the present disclosure provides an alignment mark count acquiring method, which includes the following operations.

A first time at which an exposure machine performs exposure of a first wafer is acquired, and a second time at which the exposure machine performs alignment of a second wafer is acquired. The exposure machine includes an alignment platform and an exposure platform, when a wafer is located on the exposure platform, the wafer is defined as the first wafer, the first wafer has exposure parameters, when the wafer is located on the alignment platform, the wafer is defined as the second wafer, the second wafer has the alignment mark count. A same wafer passes through the alignment platform and the exposure platform in sequence to complete the exposure process.

A first buffer time between the second time and the first time is acquired when the first time is less than the second time.

The target alignment mark count of the second wafer is determined according to the exposure parameters of the first wafer and a corresponding relationship when the first buffer time is greater than a preset value. The corresponding relationship is the relationship between exposure parameters and alignment mark counts, and the corresponding relationship is used to make the first buffer time to be less than or equal to the preset value.

The target alignment mark count is output.

DETAILED DESCRIPTION

An exemplary embodiment will be described in detail here, and an example thereof is shown in the drawings. When the following description relates to the drawings, unless otherwise indicated, the same numbers in different drawings represent the same or similar elements. The implementation modes described in the following exemplary embodiments do not represent all implementation modes consistent with the disclosure. Instead, they are only examples of devices and methods consistent with some aspects of the disclosure as detailed in the appended claims.

During photolithography exposure of the semiconductor, the exposure machine is provided with an alignment platform and an exposure platform. The photolithography exposure of a wafer should complete an alignment process and an exposure process in sequence. In the actual use of the exposure machine, it is generally necessary to continuously perform photolithography exposure on a plurality of wafers, that is, the exposure process of one wafer is executed based on the exposure platform and the alignment process of another wafer is executed based on the alignment platform at the same time. If the alignment process of another wafer has not been completed when the exposure process of one wafer is completed, the exposure can be executed only after the alignment process is completed; and this waiting time will reduce the photolithography exposure efficiency of the exposure machine. That is, shortening a difference value between the exposure time of one wafer and the alignment time of the next wafer can effectively improve the photolithography exposure efficiency of the exposure machine, so as to improve the manufacturing efficiency of a semiconductor product.

However, the alignment time of the wafer during alignment is related to the alignment mark count of the wafer. The more the alignment mark count is, the longer the alignment time is. Therefore, how to determine the appropriate alignment mark count to improve the photolithography exposure efficiency of the exposure machine and the manufacturing efficiency of the semiconductor product is a problem to be considered.

More specifically, an exposure machine refers to a device that transfers image information on a film and other transparent bodies to a surface coated with a photosensitive substance by turning on light to emit ultraviolet rays, the exposure machine is provided with an alignment platform and an exposure platform, and when a semiconductor is subjected to photolithography exposure by the exposure machine to make a product, the photolithography exposure of a wafer should complete the alignment process and exposure process in sequence. In the actual use of the exposure machine, it is generally necessary to continuously perform photolithography exposure on a plurality of wafers, that is, after one wafer has completed the alignment process and entered the exposure process, it is necessary to align another wafer based on the alignment platform at this time. If the next wafer to be exposed has not been aligned when the exposure of one wafer is completed, it needs to wait a relatively long time to expose the next wafer, which will reduce the photolithography exposure efficiency of the exposure machine. The alignment time of the wafer during alignment is related to the alignment mark count of the wafer. The more the alignment mark count is, the longer the alignment time is. Therefore, if the appropriate alignment mark count may be determined, the waiting time in the wafer photolithography exposure process may be greatly shortened, so as to improve the photolithography exposure efficiency of the exposure machine and the manufacturing efficiency of a semiconductor product.

Based on this, the present disclosure provides an alignment mark count acquiring method and device. In the alignment mark count acquiring method, the exposure time of a wafer located on an exposure platform is acquired, the alignment time of a wafer located on an alignment platform is also acquired, and a buffer time between the alignment time and the exposure time is calculated. If the buffer time is beyond a preset value, the optimal alignment mark count (a target alignment mark count) of the wafer located on the alignment platform is determined based on the corresponding relationship. The corresponding relationship is the relationship between exposure parameters and alignment mark counts. The corresponding relationship is used to make the buffer time to be less than or equal to the preset value. Therefore, the target alignment mark count determined based on the corresponding relationship may make the buffer time to be less than or equal to the preset value. The alignment mark count of the wafer located on the alignment platform is set to the target alignment mark count, so that the buffer time may be controlled to be less than or equal to the preset value, so as to improve the photolithography exposure efficiency of the exposure machine and the manufacturing efficiency of the semiconductor product.

Figure 1:
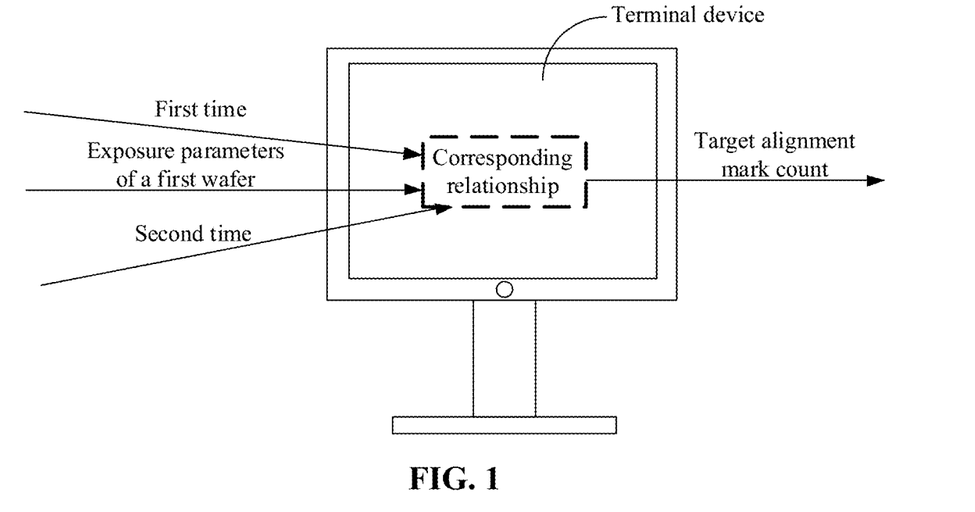
FIG. 1 is a schematic diagram of an application scene of an alignment mark count acquiring method according to some embodiments of the present disclosure.

Referring to FIG. 1, the alignment mark count acquiring method provided in the present disclosure is applied to a terminal device, such as a server special for a laboratory and a personal computer. FIG. 1 is an application schematic diagram of the alignment mark count acquiring method provided in the present disclosure. In FIG. 1, the terminal device stores the corresponding relationship between the exposure parameters and the alignment mark counts. The terminal device also receives a first time at which the exposure machine performs exposure of a first wafer, a second time at which the exposure machine performs alignment of a second wafer, and the exposure parameters of the first wafer. When the buffer time between the second time and the first time is less than the preset value, the terminal device determines and outputs the target alignment mark count of the second wafer according to the exposure parameters of the first wafer and the corresponding relationship. The alignment mark count of the second wafer during alignment is set according to the target alignment mark count, so that the buffer time between the first time and the second time may be controlled to be less than or equal to the preset value, so as to improve the photolithography exposure efficiency of the exposure machine.

Figure 2:
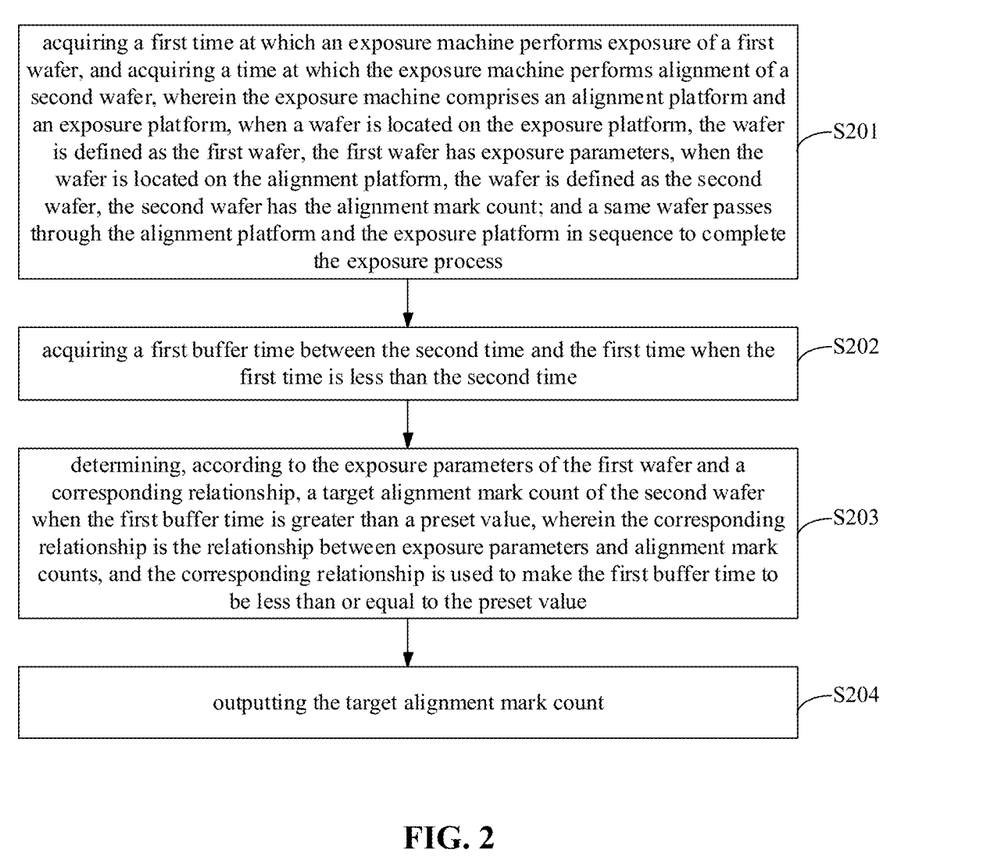
FIG. 2 is a schematic flowchart of an alignment mark count acquiring method according to the first embodiment of the present disclosure.

Referring to FIG. 2, the first embodiment of the present disclosure provides an alignment mark count acquiring method, which includes the following operations.

At S201, a first time at which an exposure machine performs exposure of a first wafer is acquired, and a time at which the exposure machine performs alignment of a second wafer is acquired. Herein, the exposure machine includes an alignment platform and an exposure platform. When the wafer is located on the exposure platform, the wafer is defined as the first wafer, the first wafer has exposure parameters. When the wafer is located on the alignment platform, the wafer is defined as the second wafer, the second wafer has an alignment mark count. The same wafer passes through the alignment platform and the exposure platform in sequence to complete the exposure process.

Referring to the above description of the photolithography exposure process by the exposure machine, the first wafer has completed the alignment process and entered the exposure process, and the second wafer is in the alignment process at this time. The first time and the second time may be recorded by a worker and input to the terminal device. The unit of the first time and the second time may be second (s).

For example, the exposure parameters of the first wafer are the exposure dose of the exposure machine when performing exposure of the first wafer, and the exposure shot count on the first wafer.

At S202, a first buffer time between the second time and the first time is acquired when the first time is less than the second time.

When the first time is less than the second time, it means that the alignment of the second wafer has not been completed when the exposure machine completes the exposure of the first wafer. At this time, it is necessary to wait for the second wafer to complete the alignment before performing the exposure of the second wafer. The first time and the second time may be understood as the time points, and the first buffer time may be understood as a difference value between the alignment end time of the second wafer and the exposure end time of the first wafer. That is, the first buffer time is the time duration required to wait for the second wafer to complete alignment when the exposure of the first wafer is ended.

The unit of the first buffer time is consistent with that of the first time and the second time. For example, if the unit of the first time and the second time is s, the unit of the first buffer time is also s.

At S203, the target alignment mark count of the second wafer is determined according to the exposure parameters of the first wafer and the corresponding relationship when the first buffer time is greater than a preset value. Herein, the corresponding relationship is the relationship between the exposure parameters and the alignment mark counts, and the corresponding relationship is used to make the first buffer time to be less than or equal to the preset value.

In order to improve the photolithography exposure efficiency of the exposure machine, the preset value may be set to a number greater than 0 but infinitely close to 0. For example, the preset value may be 0.17 or 0.03. The preset value may also be set to 0.

The corresponding relationship is the relationship between the exposure parameters of the first wafer and the alignment mark count of the second wafer. More precisely, the corresponding relationship is the relationship between each parameter contained in the exposure parameters of the first wafer and the alignment mark count. As described above, for example, the exposure parameters of the first wafer are the exposure dose when the exposure machine performs exposure of the first wafer and the exposure shot count on the first wafer. Thus, the corresponding relationship includes the relationship between the exposure dose and the alignment mark count, as well as the relationship between the exposure shot count and the alignment mark count.

The corresponding relationship is a relationship established based on the situation that the exposure process of the first wafer and the alignment process of the second wafer are ended almost at the same time. That is, the corresponding relationship is a relationship established based on the situation that a difference value between the alignment time of the second wafer and the exposure time of the first wafer is less than or equal to the preset value. Therefore, after the target alignment mark count of the second wafer is determined according to the exposure parameters of the first wafer and the corresponding relationship, the alignment time of the second wafer based on the target alignment mark count is infinitely close to the time of exposure of the first wafer. That is, the first buffer time is less than or equal to the preset value. At this time, after the exposure process of the first wafer is completed, the exposure of the second wafer may be carried out directly without waiting too long.

At S204, the target alignment mark count is output.

The terminal device may display the target alignment mark count for a worker to set the alignment process of the second wafer. The terminal device may also send the target alignment mark count to a mobile phone, a personal computer, a tablet computer and other terminal devices of the worker.

Optionally, when the first time is greater than or equal to the second time, the alignment mark count of the second wafer is output as the target alignment mark count of the second wafer. Alternatively, when the first buffer time is less than or equal to the preset value, the alignment mark count of the second wafer is output as the target alignment mark count of the second wafer. Because whether the first time is greater than or equal to the second time or the first buffer time is less than or equal to the preset value meets the requirements for the photolithography exposure efficiency of the exposure machine, the alignment mark count of the second wafer at this time may be directly output as the target alignment mark count of the second wafer.

According to the alignment mark count acquiring method provided in the embodiment, the terminal device receives the first time at which the exposure machine performs exposure of the first wafer, the second time at which the exposure machine performs alignment of the second wafer, and the exposure parameters of the first wafer. When the first buffer time between the second time and the first time is greater than the preset value, the terminal device determines and outputs the target alignment mark count of the second wafer according to the exposure parameters of the first wafer and the corresponding relationship. After the alignment mark count of the second wafer during alignment is set according to the target alignment mark count, the buffer time between the first time and the second time may be controlled to be less than or equal to the preset value, so as to improve the photolithography exposure efficiency of the exposure machine and improve the manufacturing efficiency of the semiconductor product.

Figure 3:
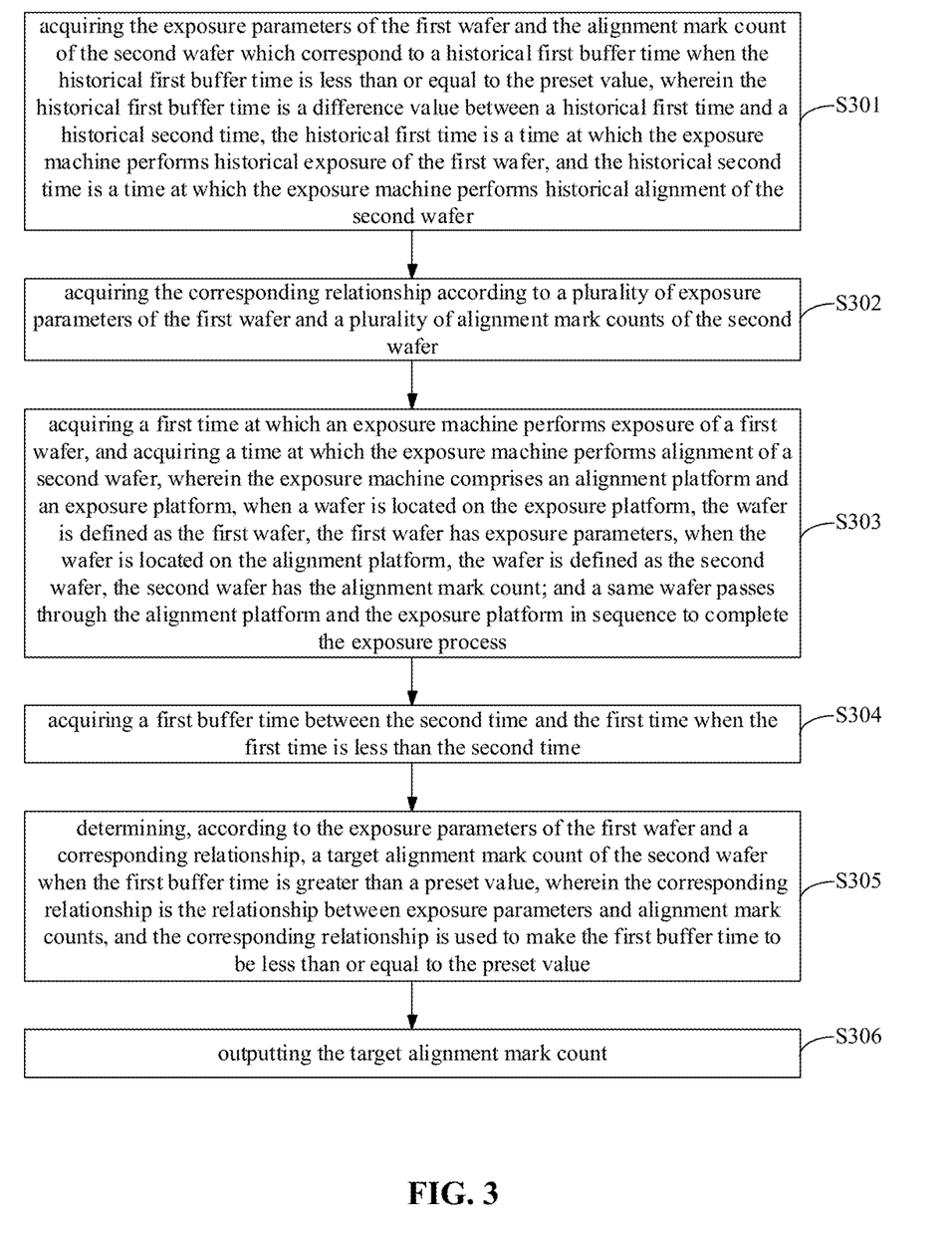
FIG. 3 is a schematic flowchart of an alignment mark count acquiring method according to the second embodiment of the present disclosure.

Referring to FIG. 3, in the alignment mark count acquiring method provided in the second embodiment of the present disclosure, acquiring the corresponding relationship is further described based on the first embodiment. In the embodiment, the alignment mark count acquiring method includes the following operations.

At S301, when a historical first buffer time is less than or equal to the preset value, the exposure parameters of a first wafer and the alignment mark count of a second wafer which correspond to the historical first buffer time are acquired. Herein, the historical first buffer time is a difference value between a historical first time and a historical second time, the historical first time is the time at which the exposure machine performs historical exposure of the first wafer, and the historical second time is the time at which the exposure machine performs historical alignment of the second wafer.

The historical exposure refers to one previous exposure of the first wafer by the exposure machine, and the historical first time refers to the exposure time at which the exposure machine performs the one previous exposure of the first wafer. Similarly, the historical alignment refers to one previous alignment of the second wafer by the exposure machine, and the historical second time refers to the alignment time at which the exposure machine performs the one previous alignment of the second wafer. That is, the historical first buffer time, the historical first time and the historical second time mentioned in this operation are the time parameters during one photolithography exposure of the first wafer and the second wafer by the exposure machine at a previous time. The historical first buffer time, the historical first time and the historical second time correspond to each other.

After the historical first buffer time is determined to be less than or equal to the preset value, the exposure parameters of the first wafer and the alignment mark count of the second wafer are acquired. The exposure parameters of the first wafer refer to the exposure parameters of the first wafer which correspond to the historical first buffer time. The alignment mark count of the second wafer refers to the alignment mark count of the second wafer corresponding to the historical first buffer time.

At S302, the corresponding relationship is acquired according to a plurality of exposure parameters of the first wafer and a plurality of alignment mark counts of the second wafer.

The exposure parameters of the first wafer and the alignment mark count of the second wafer refer to the exposure parameters of the first wafer and the alignment mark count of the second wafer when the historical first buffer time is less than or equal to the preset value.

Optionally, the exposure parameters of the first wafer include the exposure dose of the first wafer and the exposure shot count of the first wafer, and the corresponding relationship includes the first corresponding relationship and the second corresponding relationship. The first corresponding relationship refers to the relationship between the exposure dose of the first wafer and the alignment mark count of the second wafer, and the second corresponding relationship refers to the relationship between the exposure shot count of the first wafer and the alignment mark count of the second wafer.

When acquiring the first corresponding relationship, the terminal device acquires the first corresponding relationship according to a plurality of exposure doses of the first wafer and a plurality of alignment mark counts of the second wafer.

An exposure machine with a KRF model is taken as an example, the limit exposure dose of the KRF exposure machine during wafer exposure is 50 mj/cm$^2$. When the preset value is set in the range of 0.18-0.2, a plurality of exposure doses of the first wafer when the historical first buffer time of the KRF exposure machine is less than or equal to the preset value are acquired. As shown in Table 1 below, when the historical first buffer time is 0.18 s, the acquired exposure dose of the first wafer is 24 mj/cm$^2$ and the acquired alignment mark count of the second wafer is 16.9. When the historical first buffer time is 0.17 s, the acquired exposure dose of the first wafer is 36 mj/cm$^2$ and the acquired alignment mark count of the second wafer is 17. By analogy, in Table 1, a total of 7 groups of data are acquired as the basis for acquiring the first corresponding relationship. In the 7 groups of data, the plurality of acquired exposure doses of the first wafer include 24 mj/cm$^2$, 36 mj/cm$^2$, 45 mj/cm$^2$, 50 mj/cm$^2$, 55 mj/cm$^2$, 60 mj/cm$^2$ and 65 mj/cm$^2$. Correspondingly, the plurality of acquired alignment mark counts of the second wafer include 16.9, 17, 17.1, 17.1, 18.6, 22.2 and 28.2.

TABLE 1

| DOSE (mj/cm$^2$) | 24 | 36 | 45 | 50 | 55 | 60 | 65 |
|---|---|---|---|---|---|---|---|
| buffer time/s | 0.18 | 0.17 | 0.15 | 0.1 | −0.1 | −0.7 | −1.7 |
| mark counts | 16.9 | 17 | 17.1 | 17.1 (Z) | 18.6 | 22.2 | 28.2 |

Figure 4:
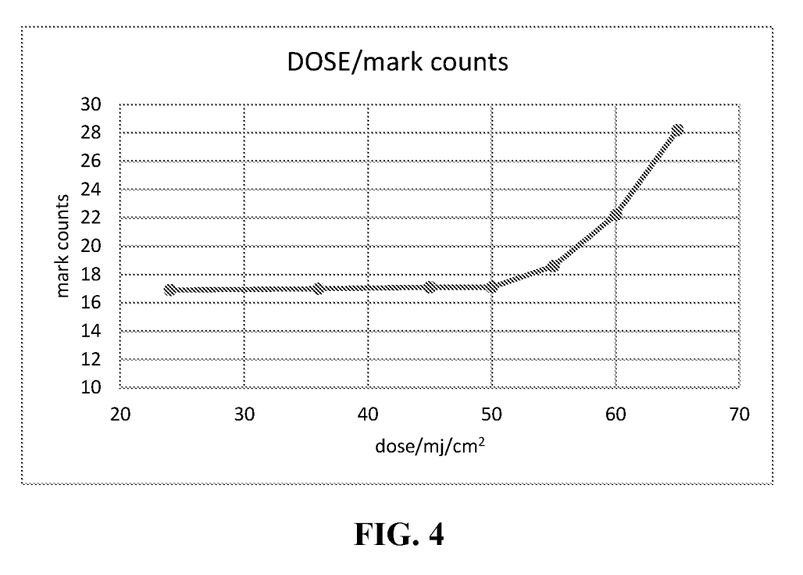
FIG. 4 is a schematic diagram of a first corresponding relationship according to the second embodiment of the present disclosure.

The relationship between the exposure doses of the first wafer and the alignment mark counts of the second wafer is simulated according to the data in Table 1, and the schematic diagram of the finally obtained first corresponding relationship is illustrated in FIG. 4.

The first corresponding relationship is as follows.

When the exposure dose of the first wafer is less than or equal to 50 mj/cm$^2$ (DOSE is less than 50 mj/cm$^2$), the increase of the exposure dose of the first wafer has little effect on the alignment mark count of the second wafer. When the exposure dose of the first wafer is greater than 50 mj/cm$^2$, the relationship between DOSE and mark count is that y=0.048X2−4.8X+120+Z. X represents the exposure dose of the first wafer, Y represents the alignment mark count of the second wafer, and Z represents a constant.

When acquiring the second corresponding relationship, the terminal device acquires the second corresponding relationship according to a plurality of exposure shot counts of the first wafer and a plurality of alignment mark counts of the second wafer.

An exposure machine with a KRF model is taken as an example, the limit exposure dose of the KRF exposure machine during wafer exposure is 50 mj/cm$^2$. At this time, the maximum value of the exposure dose of the first wafer is set to 50 mj/cm$^2$ to acquire the alignment mark count of the second wafer when the historical first buffer time is less than or equal to the preset value. As shown in Table 2 below, a total of 6 groups of data are acquired as the basis for acquiring the second corresponding relationship. In the 6 groups of data, the plurality of acquired exposure shot counts of the first wafer include 101, 106, 108, 113, 121 and 130. Correspondingly, the acquired alignment mark counts of the second wafer include 14, 17, 18.5, 22, 28 and 34.

TABLE 2

| Shot count | 101 | 106 | 108 | 113 | 121 | 130 |
|---|---|---|---|---|---|---|
| Mark counts | 14 | 17 | 18.5 | 22 | 28 | 34 |

Figure 5:
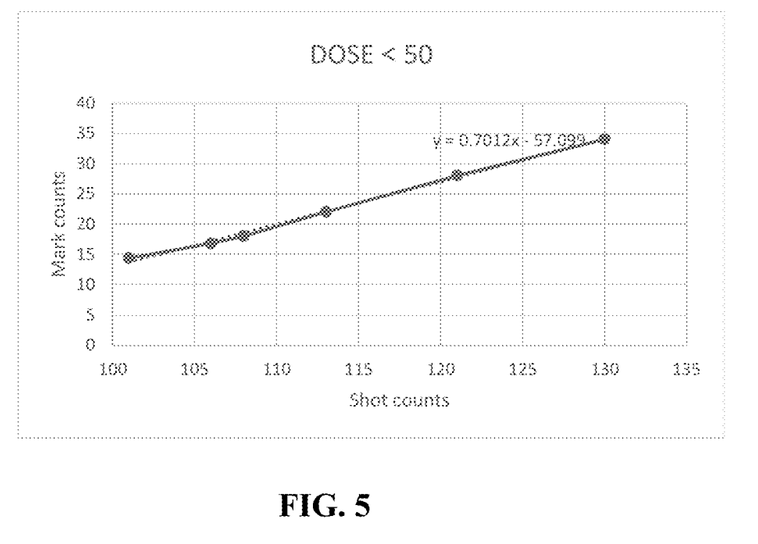
FIG. 5 is a schematic diagram of a second corresponding relationship according to the second embodiment of the present disclosure.

The relationship between the exposure shot counts of the first wafer and the alignment mark counts of the second wafer is simulated according to the data in Table 2, and the schematic diagram of the finally obtained second corresponding relationship is illustrated in FIG. 5.

The second corresponding relationship is that Y=0.7012X−57.099, X represents the exposure shot count of the first wafer, and Y represents the alignment mark count of the second wafer.

At S303, a first time at which an exposure machine performs exposure of a first wafer is acquired, and a second time at which the exposure machine performs alignment of a second wafer is acquired. The exposure machine includes an alignment platform and an exposure platform. When the wafer is located on the exposure platform, the wafer is defined as the first wafer, the first wafer has exposure parameters. When the wafer is located on the alignment platform, the wafer is defined as the second wafer, the second wafer has an alignment mark count. The same wafer passes through the alignment platform and the exposure platform in sequence to complete the exposure process.

At S304, a first buffer time between the second time and the first time is acquired when the first time is less than the second time.

At S305, a target alignment mark count of the second wafer is determined according to the exposure parameters of the first wafer and the corresponding relationship when the first buffer time is greater than a preset value. The corresponding relationship is the relationship between the exposure parameters and the alignment mark counts, and the corresponding relationship is used to make the first buffer time to be less than or equal to the preset value.

At S306, the target alignment mark count is output.

The relevant description of S303 to S306 may refer to the relevant description of S201 to S204 in the first embodiment, which will not be elaborated here.

The operations at S301 to S302 may be executed before the operation at S303 or before the operation at S305. The operations at S301 to S302 are executed only once. After acquiring the corresponding relationship, the terminal device stores the corresponding relationship and calls the corresponding relationship when it needs to be used.

The alignment mark count acquiring method provided in the embodiment describes how to acquire the corresponding relationship on the basis of the first embodiment. When acquiring the corresponding relationship, it is necessary to acquire a large number of exposure parameters of the first wafer and a large number of alignment mark counts of the second wafer based on the fact that the historical first buffer time is less than or equal to the preset value. Then, the corresponding relationship is acquired according to a large number of exposure parameters of the first wafer and a large number of alignment mark counts of the second wafer. The exposure parameters of the first wafer include the exposure dose of the first wafer and the exposure shot count of the first wafer. The first corresponding relationship in the corresponding relationship may be acquired by the exposure doses of the first wafer and the alignment mark counts of the second wafer, and the second corresponding relationship in the corresponding relationship may be acquired by the exposure shot counts of the first wafer and the alignment mark counts of the second wafer.

After experimental verification, whether the target alignment mark count is determined according to the first corresponding relationship or the second corresponding relationship, the results are consistent. Therefore, at S305, the target alignment mark count of the second wafer may be determined according to the first corresponding relationship and/or the second corresponding relationship.

Figure 6:
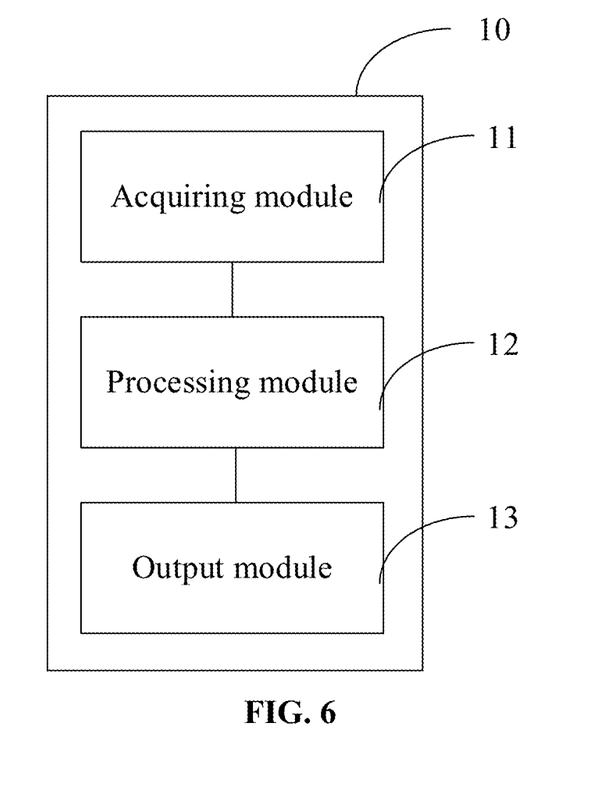
FIG. 6 is a schematic diagram of an alignment mark count acquiring device according to the third embodiment of the present disclosure.

Referring to FIG. 6, the third embodiment of the present disclosure provides an alignment mark count acquiring device 10, which includes an acquiring module 11, a processing module 12 and an output module 13.

The acquiring module 11 is configured to acquire a first time at which an exposure machine performs exposure of a first wafer, and acquire a second time at which the exposure machine performs alignment of a second wafer. The exposure machine includes an alignment platform and an exposure platform, when the wafer is located on the exposure platform, the wafer is defined as the first wafer, the first wafer has exposure parameters, when the wafer is located on the alignment platform, the wafer is defined as the second wafer, the second wafer has an alignment mark count. The same wafer passes through the alignment platform and the exposure platform in sequence to complete the exposure process.

The acquiring module 11 is further configured to acquire a first buffer time between the second time and the first time when the first time is less than the second time.

The processing module 12 is configured to determine, according to the exposure parameters of the first wafer and the corresponding relationship, a target alignment mark count of the second wafer when the first buffer time is greater than a preset value. The corresponding relationship is the relationship between the exposure parameters and the alignment mark counts, and the corresponding relationship is used to make the first buffer time to be less than or equal to the preset value.

The output module is configured to output the target alignment mark count.

The acquiring module 11 is further configured to acquire the exposure parameters of a first wafer and the alignment mark count of a second wafer which correspond to a historical first buffer time when the historical first buffer time is less than or equal to the preset value. The historical first buffer time is a difference value between a historical first time and a historical second time, the historical first time is the time at which the exposure machine performs historical exposure of the first wafer, and the historical second time is the time at which the exposure machine performs historical alignment of the second wafer. The acquiring module 11 is further configured to acquire the corresponding relationship according to a plurality of exposure parameters of the first wafer and a plurality of alignment mark counts of the second wafer.

The exposure parameters of the first wafer includes the exposure dose of the first wafer and the exposure shot count of the first wafer, and the corresponding relationship includes the first corresponding relationship and the second corresponding relationship. The acquiring module 11 is specifically configured to acquire the first corresponding relationship according to the plurality of exposure doses of the first wafer and the plurality of alignment mark counts of the second wafer, and acquire the second corresponding relationship according to the plurality of exposure shot counts of the first wafer and the plurality of alignment mark counts of the second wafer.

The output module 13 is further configured to output the alignment mark count of the second wafer as the target alignment mark count of the second wafer when the first time is greater than or equal to the second time.

The output module 13 is further configured to output the alignment mark count of the second wafer as the target alignment mark count of the second wafer when the first buffer time is less than or equal to the preset value.

The alignment mark count acquiring device provided in the embodiment may be used to execute the alignment mark count acquiring method provided in the first embodiment to the second embodiment above, and the specific implementation and the technical effect are similar, which will not be elaborated here.

Figure 7:
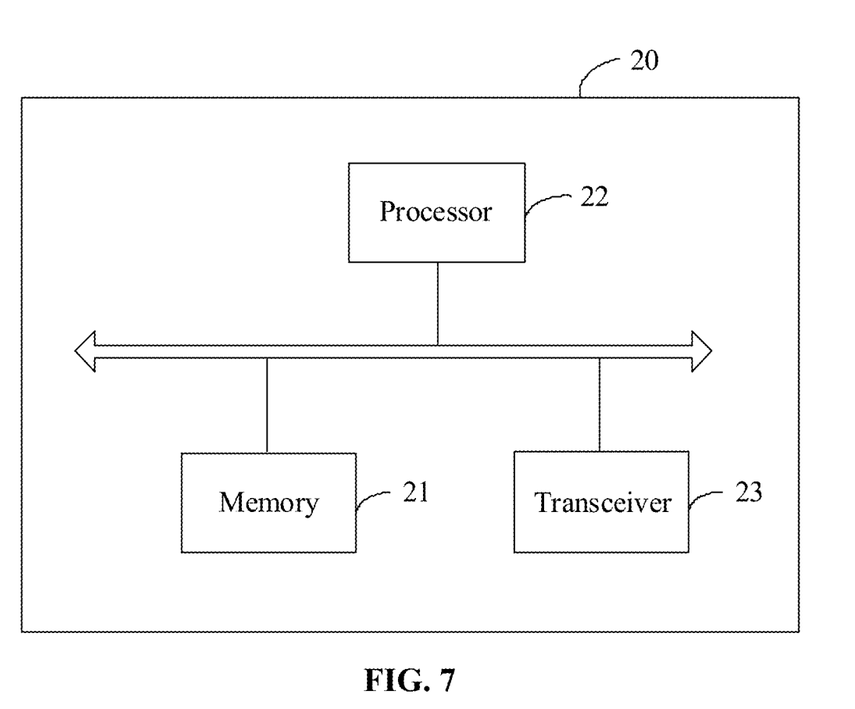
FIG. 7 is a schematic diagram of a computer device according to an embodiment of the present disclosure.

Referring to FIG. 7, the fourth embodiment of the present disclosure further provides a terminal device 20, which includes a memory 21, a processor 22 and a transceiver 23. The memory 21 is configured to store instructions. The transceiver 23 is configured to communicate with other devices. The processor 22 is configured to execute the instructions stored in the memory 21, to enable the terminal device to execute the alignment mark acquiring method provided in the first embodiment to the second embodiment above. The specific implementation mode and the technical effect are similar, which will not be elaborated here.

The present disclosure further provides a computer readable storage medium, having stored thereon instructions executable by a computer. When the instructions are executed, the computer is enabled to execute the alignment mark acquiring method provided in the first embodiment to the second embodiment above. The specific implementation and the technical effect are similar, which will not be elaborated here.

The present disclosure further provides a computer program product, which includes a computer program that, when executed by the processor, implements the alignment mark acquiring method provided in the first embodiment to the second embodiment 2 above. The specific implementation and the technical effect are similar, which will not be elaborated here.

It is to be noted that, the computer readable storage medium may be a Read Only Memory (ROM), a Programmable Read-Only Memory (PROM), an Erasable Programmable Read-Only Memory (EPROM), an Electrically Erasable Programmable Read-Only Memory (EEPROM), a Ferromagnetic Random Access Memory (FRAM), a Flash Memory, a magnetic surface memory, a compact disc, a Compact Disc Read-Only Memory (CD-ROM) and the like. The computer readable storage medium may also be various electronic devices including one or any combination of the above memories, such as mobile phones, computers, tablet devices, personal digital assistants, etc.

It is to be noted that, in this context, the terms "include", "containing" or any other variation thereof are intended to cover non-exclusive inclusion, so that a process, method, article or device that includes a series of elements includes not only those elements, but also other elements not explicitly listed, or elements inherent in such process, method, article or device. Without further restrictions, the element defined by the statement "including a . . . " does not exclude the existence of another same element in the process, method, article or device including the element.

The above serial number of the embodiment in the present disclosure is only for description and does not represent the advantages and disadvantages of the embodiment.

Through the description of the above embodiments, those skilled in the art can clearly understand that the above embodiment method can be realized by means of software and necessary general hardware platforms. Of course, it can also be realized by hardware, but in many cases, the former is a better embodiment. Based on this understanding, the technical solution of the present disclosure essentially or the part that contributes to the traditional art can be embodied in the form of a software product. The computer software product is stored in a storage medium (such as a ROM/RAM, a magnetic disc and a compact disc), including several commands to make a terminal device (which may be a mobile phone, a computer, a server, an air conditioner, Or a network device, etc.) to execute the method described in various embodiments of the present disclosure.

The present disclosure is described with reference to the flowcharts and/or block diagrams of the method, the device (system), and the computer program product according to the embodiment of the present disclosure. It should be understood that, each process and/or block in the flowchart and/or block diagram and the combination of processes and/or blocks in the flowchart and/or block diagram may be implemented by a computer program command. These computer program commands may be provided for the processor of a general-purpose computer, a special-purpose computer, an embedded processor or other programmable data processing devices to generate a machine, and therefore, a device for realizing the functions specified in one or more processes of the flowchart and/or one or more blocks of the block diagram is generated through the command executed by a processor of a computer or other programmable data processing devices.

These computer program commands may also be stored in a computer-readable memory capable of guiding a computer or other programmable data processing devices to work in a specific manner, so that the commands stored in the computer readable memory generates a manufacturing product including a command device, The command device implements the functions specified in one or more processes of the flowchart and/or one or more blocks of the block diagram.

These computer program commands may also be loaded on a computer or other programmable data processing devices, so that a series of operation steps are performed on the computer or other programmable devices to produce computer implemented processing, thus, commands executed on a computer or other programmable devices provide steps for implementing the functions specified in one or more processes of the flowchart and/or one or more blocks of the block diagram.

The above is only the preferred embodiment of the present disclosure and does not limit the scope of the patent of the present disclosure. Any equivalent structure or equivalent process transformation made by using the contents of the description and drawings of the present disclosure, or directly or indirectly applied in other relevant technical fields, are similarly included in the scope of patent protection of the present disclosure.

What is claimed is:

1. A method for acquiring an alignment mark count, comprising:
   acquiring a first time at which an exposure machine performs exposure of a first wafer, and acquiring a second time at which the exposure machine performs alignment of a second wafer, wherein the exposure machine comprises an alignment platform and an exposure platform, when a wafer is located on the exposure platform, the wafer is defined as the first wafer, the first wafer has exposure parameters, when the wafer is located on the alignment platform, the wafer is defined as the second wafer, the second wafer has the alignment mark count; and a same wafer passes through the alignment platform and the exposure platform in sequence to complete the exposure process;
   acquiring a first buffer time between the second time and the first time when the first time is less than the second time;
   determining, according to the exposure parameters of the first wafer and a corresponding relationship, a target alignment mark count of the second wafer when the first buffer time is greater than a preset value, wherein the corresponding relationship is a relationship between exposure parameters and alignment mark counts, and the corresponding relationship is used to make the first buffer time to be less than or equal to the preset value; and
   outputting the target alignment mark count;
   wherein the exposure parameters of the first wafer comprise an exposure dose of the first wafer and an exposure shot count of the first wafer, the corresponding relationship comprises a first corresponding relationship and a second corresponding relationship, the first corresponding relationship is a relationship between exposure doses and alignment mark counts, the second corresponding relationship is a relationship between exposure shot counts and alignment mark counts, and the second corresponding relationship is that $Y\_=0.7012X-57.099$, X represents the exposure shot count of the first wafer, and Y represents the alignment mark count of the second wafer.

2. The method according to claim 1, further comprising:
   acquiring the exposure parameters of the first wafer and the alignment mark count of the second wafer which correspond to a historical first buffer time when the historical first buffer time is less than or equal to the preset value, wherein the historical first buffer time is a difference value between a historical first time and a historical second time, the historical first time is a time at which the exposure machine performs historical exposure of the first wafer, and the historical second time is a time at which the exposure machine performs historical alignment of the second wafer; and
   acquiring the corresponding relationship according to a plurality of exposure parameters of the first wafer and a plurality of alignment mark counts of the second wafer.

3. The method according to claim 2, wherein acquiring the corresponding relationship according to the plurality of exposure parameters of the first wafer and the plurality of alignment mark counts of the second wafer comprises:
   acquiring the first corresponding relationship according to a plurality of exposure doses of the first wafer and the plurality of alignment mark counts of the second wafer; and
   acquiring the second corresponding relationship according to a plurality of exposure shot counts of the first wafer and the plurality of alignment mark counts of the second wafer.

4. The method according to claim 1, further comprising:
   outputting the alignment mark count of the second wafer as the target alignment mark count of the second wafer when the first time is greater than or equal to the second time.

5. The method according to claim 1, further comprising:
   outputting the alignment mark count of the second wafer as the target alignment mark count of the second wafer when the first buffer time is less than or equal to the preset value.

6. A device for acquiring an alignment mark count, comprising a memory, a processor and a transceiver, wherein the memory is configured to storage instructions, the transceiver is configured to communicate with other devices, and the processor is configured to:
   acquire a first time at which an exposure machine performs exposure of a first wafer, and acquire a second time at which the exposure machine performs alignment of a second wafer, wherein the exposure machine comprises an alignment platform and an exposure platform, when a wafer is located on the exposure platform, the wafer is defined as the first wafer, the first wafer has exposure parameters, when the wafer is located on the alignment platform, the wafer is defined as the second wafer, the second wafer has the alignment mark count; and a same wafer passes through the alignment platform and the exposure platform in sequence to complete the exposure process;

acquire a first buffer time between the second time and the first time when the first time is less than the second time;

determine, according to the exposure parameters of the first wafer and a corresponding relationship, a target alignment mark count of the second wafer when the first buffer time is greater than a preset value, wherein the corresponding relationship is a relationship between exposure parameters and alignment mark counts, and the corresponding relationship is used to make the first buffer time to be less than or equal to the preset value; and output the target alignment mark count;

wherein the exposure parameters of the first wafer comprise an exposure dose of the first wafer and an exposure shot count of the first wafer, the corresponding relationship comprises a first corresponding relationship and a second corresponding relationship, the first corresponding relationship is a relationship between exposure doses and alignment mark counts, the second corresponding relationship is a relationship between exposure shot counts and alignment mark counts, and the second corresponding relationship is that $Y_=0.7012X-57.099$, X represents the exposure shot count of the first wafer, and Y represses the alignment mark count of the second wafer.

7. The device according to claim 6, wherein the processor is further configured to:

acquire the exposure parameters of the first wafer and the alignment mark count of the second wafer which correspond to a historical first buffer time when the historical first buffer time is less than or equal to the preset value, wherein the historical first buffer time is a difference value between a historical first time and a historical second time, the historical first time is a time at which the exposure machine performs historical exposure of the first wafer, and the historical second time is a time at which the exposure machine performs historical alignment of the second wafer; and acquire the corresponding relationship according to a plurality of exposure parameters of the first wafer and a plurality of alignment mark counts of the second wafer.

8. The device according to claim 7, wherein the processor is specifically configured to:

acquire the first corresponding relationship according to a plurality of exposure doses of the first wafer and the plurality of alignment mark counts of the second wafer; and acquire the second corresponding relationship according to a plurality of exposure shot counts of the first wafer and the plurality of alignment mark counts of the second wafer.

9. The device according to claim 6, wherein the processor is further configured to:

output the alignment mark count of the second wafer as the target alignment mark count of the second wafer when the first time is greater than or equal to the second time.

10. The device according to claim 6, wherein the processor is further configured to:

output the alignment mark count of the second wafer as the target alignment mark count of the second wafer when the first buffer time is less than or equal to the preset value.

11. A non-transitory computer readable storage medium, having stored thereon instructions executable by a computer, wherein when the instructions are executed, the computer is enabled to execute operations of:

acquiring a first time at which an exposure machine performs exposure of a first wafer, and acquiring a second time at which the exposure machine performs alignment of a second wafer, wherein the exposure machine comprises an alignment platform and an exposure platform, when a wafer is located on the exposure platform, the wafer is defined as the first wafer, the first wafer has exposure parameters, when the wafer is located on the alignment platform, the wafer is defined as the second wafer, the second wafer has the alignment mark count; and a same wafer passes through the alignment platform and the exposure platform in sequence to complete the exposure process;

acquiring a first buffer time between the second time and the first time when the first time is less than the second time;

determining, according to the exposure parameters of the first wafer and a corresponding relationship, a target alignment mark count of the second wafer when the first buffer time is greater than a preset value, wherein the corresponding relationship is a relationship between exposure parameters and alignment mark counts, and the corresponding relationship is used to make the first buffer time to be less than or equal to the preset value; and outputting the target alignment mark count;

wherein the exposure parameters of the first wafer comprise, an exposure dose of the first water and an exposure shot count of the first wafer, the corresponding relationship comprises a first corresponding relationship and a second corresponding relationship, the first corresponding relationship is a relationship between exposure doses and alignment mark counts, the second corresponding relationship is a relationship between exposure shot counts and alignment mark counts, and the second corresponding relationship is that $Y_=0.7012X-57.099$, X represents the exposure shot count of the first wafer, and Y represents the alignment mark count of the second wafer.

12. The non-transitory computer readable storage medium according to claim 11, wherein the computer is further enabled to execute operations of:

acquiring the exposure parameters of the first wafer and the alignment mark count of the second wafer which correspond to a historical first buffer time when the historical first buffer time is less than or equal to the preset value, wherein the historical first buffer time is a difference value between a historical first time and a historical second time, the historical first time is a time at which the exposure machine performs historical exposure of the first wafer, and the historical second time is a time at which the exposure machine performs historical alignment of the second wafer; and acquiring the corresponding relationship according to a plurality of exposure parameters of the first wafer and a plurality of alignment mark counts of the second wafer.

13. The non-transitory computer readable storage medium according to claim 12, wherein the computer is enabled to execute operations of:
- acquiring the first corresponding relationship according to a plurality of exposure doses of the first wafer and the plurality of alignment mark counts of the second wafer; and
- acquiring the second corresponding relationship according to a plurality of exposure shot counts of the first wafer and the plurality of alignment mark counts of the second wafer.

14. The non-transitory computer readable storage medium according to claim 11, wherein the computer is further enabled to execute operation of:
- outputting the alignment mark count of the second wafer as the target alignment mark count of the second wafer when the first time is greater than or equal to the second time.

15. The non-transitory computer readable storage medium according to claim 11, wherein the computer is further enabled to execute operation of:
- outputting the alignment mark count of the second wafer as the target alignment mark count of the second wafer when the first buffer time is less than or equal to the preset value.

* * * * *